United States Patent
Choi et al.

(10) Patent No.: US 11,288,570 B2
(45) Date of Patent: Mar. 29, 2022

(54) SEMICONDUCTOR CHANNEL BASED NEUROMORPHIC SYNAPSE DEVICE INCLUDING TRAP-RICH LAYER

(71) Applicant: Korea Advanced Institute of Science And Technology, Daejeon (KR)

(72) Inventors: Yang-Kyu Choi, Daejeon (KR); Jae Hur, Daejeon (KR)

(73) Assignee: KOREA ADVANCED INSTITUTE OF SCIENCE AND TECHNOLOGY, Daejeon (KR)

( * ) Notice: Subject to any disclaimer, the term of this patent is extended or adjusted under 35 U.S.C. 154(b) by 751 days.

(21) Appl. No.: 16/169,676

(22) Filed: Oct. 24, 2018

(65) Prior Publication Data

US 2019/0122098 A1   Apr. 25, 2019

(30) Foreign Application Priority Data

Oct. 25, 2017  (KR) .................. 10-2017-0139177
Sep. 28, 2018  (KR) .................. 10-2018-0116566

(51) Int. Cl.
*G06N 3/06* (2006.01)
*G06N 3/08* (2006.01)
(Continued)

(52) U.S. Cl.
CPC ............ *G06N 3/049* (2013.01); *G06N 3/0635* (2013.01); *G06N 3/08* (2013.01); *G11C 13/0007* (2013.01); *G11C 13/0011* (2013.01)

(58) Field of Classification Search
CPC ... G06N 3/049; G06N 3/0635; G11C 13/0002
See application file for complete search history.

(56) References Cited

U.S. PATENT DOCUMENTS

2014/0063908 A1* 3/2014 Tsukamoto ........ G11C 13/0069
  365/148
2016/0343430 A1* 11/2016 Jackson ............. G11C 13/0002
(Continued)

FOREIGN PATENT DOCUMENTS

JP   2009-049137 A   3/2009
KR   101517915 B1   5/2015

OTHER PUBLICATIONS

U.S. Appl. No. 62/531,924, filed Jul. 2017, Li; Xia.*

*Primary Examiner* — Hal Schnee
(74) *Attorney, Agent, or Firm* — Foley & Lardner LLP

(57) ABSTRACT

A semiconductor channel based neuromorphic synapse device 1 including a trap-rich layer may be provided that includes: a first to a third semiconductor regions which are formed on a substrate and are sequentially arranged; a word line which is electrically connected to the first semiconductor region; a trap-rich layer which surrounds the second semiconductor region; and a bit line which is electrically connected to the third semiconductor region. When a pulse with positive (+) voltage is applied to the word line, a concentration of electrons emitted from the trap-rich layer to the second semiconductor region increases and a resistance of the second semiconductor region decreases. When a pulse with negative (−) voltage is applied to the word line, a concentration of electrons trapped in the trap-rich layer from the second semiconductor region increases and the resistance of the second semiconductor region increases.

7 Claims, 5 Drawing Sheets

(51) Int. Cl.
   *G11C 13/00*   (2006.01)
   *G06N 3/04*    (2006.01)
   *G06N 3/063*   (2006.01)

(56) References Cited

U.S. PATENT DOCUMENTS

| | | | |
|---|---|---|---|
| 2017/0213821 A1* | 7/2017 | Or-Bach | H01L 21/76254 |
| 2018/0247946 A1* | 8/2018 | Lee | G11C 16/0416 |
| 2019/0019564 A1* | 1/2019 | Li | G11C 11/1653 |
| 2019/0088323 A1* | 3/2019 | Merced-Grafals | G11C 13/0007 |

* cited by examiner

SEMICONDUCTOR CHANNEL BASED NEUROMORPHIC SYNAPSE DEVICE INCLUDING TRAP-RICH LAYER

CROSS REFERENCE TO RELATED APPLICATIONS

This application claims priority to South Korean Appl. No. 10-2017-0139177, filed Oct. 25, 2017; and to South Korean Appl. No. 10-2018-0116566, filed Sep. 28, 2018; the contents of both of which are incorporated by reference herein in their entirety.

BACKGROUND

Field

The present disclosure relates to a semiconductor channel based neuromorphic synapse device including a trap-rich layer.

Description of the Related Art

As a semiconductor based transistor reaches its limits in scaling, there is a requirement for a new concept for overcoming the limitation of the existing Von Neumann computer system. For example, attempts are being made to implement a system which imitates human brain. This is called a neuromorphic system, and more and more attention is now paid to the neuromorphic system by researchers in both fields of software and hardware.

In particular, recently, with a machine learning technology as a beginning, a deep learning technology has been adopted. By using these, as a result, there have been rapid developments in software for the neuromorphic system, such as artificial intelligence Alpha Go, etc.

However, the software based neuromorphic system is required to process a great deal amount of information that has not existed before. Therefore, new hardware suitable for this should be indispensably presented. Currently, attentions are paid to resistive switching random access memory (RRAM) or phase-change random access memory (PcRAM). These devices simulate analog data such as the human nervous system by changing the resistance of a channel itself through which electric current flows electrically. However, due to the characteristics of these devices, these devices use variable resistance characteristics of the channel through which the electric current flows. Therefore, these devices are highly dependent on the type of material and have poor endurance.

On the other hand, the existing metal oxide semiconductor field effect transistor (MOSFET) based memory device has more excellent reliability/endurance than those of the proposed memristor devices. The MOSFET based memory device has been used as a neuromorphic device before. However, the use of four terminals makes it difficult to reduce the density and causes the circuit implementation to be more complicated.

SUMMARY

The object of the present invention is designed to overcome the above-described problems and to provide a semiconductor channel based neuromorphic synapse device including a trap-rich layer and a manufacturing method of the same.

However, the object of the present invention is not limited to the above description and can be variously extended without departing from the scope and spirit of the present invention.

One embodiment of the present invention is a semiconductor channel based neuromorphic synapse device including a trap-rich layer. The semiconductor channel based neuromorphic synapse device including a trap-rich layer includes: a first to a third semiconductor regions which are formed on a substrate and are sequentially arranged; a word line which is electrically connected to the first semiconductor region; a trap-rich layer which surrounds the second semiconductor region; and a bit line which is electrically connected to the third semiconductor region. When a pulse with positive (+) voltage is applied to the word line, a concentration of electrons emitted from the trap-rich layer to the second semiconductor region increases and a resistance of the second semiconductor region decreases. When a pulse with negative (−) voltage is applied to the word line, a concentration of electrons trapped in the trap-rich layer from the second semiconductor region increases and the resistance of the second semiconductor region increases.

The bit line may contact the third semiconductor region and the trap-rich layer.

The first to third semiconductor regions may be formed to have a vertical structure or a horizontal structure on the substrate.

The first to third semiconductor regions may include at least one of silicon (Si), germanium (Ge), group compound, and 2-D material (at least one of Carbon nanotube, $MoS_2$, and graphene).

N-type or P-type impurity may be ion-implanted at a concentration higher than $5\times10^{18}$ $cm^{-3}$ into the first to third semiconductor regions.

N-type or P-type impurity may be ion-implanted at different concentrations into the first to third semiconductor regions.

The N-type or P-type impurity may be ion-implanted at a concentration higher than $1\times10^{19}$ $cm^{-3}$ into the first and the third semiconductor regions, and N-type or P-type impurity may be ion-implanted at a concentration less than $1\times10^{19}$ $cm^{-3}$ into the second semiconductor region.

The trap-rich layer may include at least one of silicon nitride ($Si_3N_4$), nitride, silicon oxynitride (SiON), silicon oxide ($SiO_2$), solid oxide film, aluminum oxide ($Al_2O_3$), and hafnium oxide ($HfO_2$).

Other details of the present invention are included in the detailed description and drawings.

According to the semiconductor channel based neuromorphic synapse device including a trap-rich layer and the manufacturing method of the same, it is possible to implement a two-terminal semiconductor based neuromorphic synapse device having excellent endurance.

Specifically, in the neuromorphic synapse device according to the embodiment of the present invention, the trap concentration of the trap-rich layer varies depending on the sign of the pulse applied to the word line and the number of the pulses. Considering a case where N-type impurity is implanted into a region that is not surrounded by the trap-rich layer, when a pulse with positive voltage is applied to the word line, electrons escape from the trap-rich layer. In this case, the trap-rich layer has a positive potential, and thus, the electrons gather on the channel. Therefore, the channel resistance decreases and the magnitude of current increases. The number of electrons which are emitted from the trap-rich layer increases with the increase of the number of the pulses, so that the magnitude of current increases as much as the increase of the number of the pulses.

Meanwhile, when a pulse with negative voltage is applied, electrons are trapped in the trap-rich layer. Here, the trap-rich layer has a negative potential, and thus, the electrons of which the number is relatively small gather on the channel. Therefore, the channel resistance increases and the magnitude of current decreases. Similarly, the number of electrons which are absorbed in the trap-rich layer increases with the increase of the number of the pulses, so that the magnitude of current decreases as much as the increase of the number of the pulses. The magnitude of current can be controlled in an analog system manner by means of the number of the pulses, so that potentiation and depression characteristics of the neuromorphic synapse can be implemented.

Also, the level of the trap is controlled by controlling the width or frequency of the applied pulse. As a result, spike timing dependent plasticity (STDP), short term plasticity (STP), and long term plasticity (LTP) characteristics of the synapse of a real living creature can be implemented.

However, the effect of the present invention is not limited to the above description and can be variously extended without departing from the scope and spirit of the present invention.

DETAILED DESCRIPTION

The features, advantages and method for accomplishment of the present invention will be more apparent from referring to the following detailed embodiments described as well as the accompanying drawings. However, the present invention is not limited to the embodiment to be disclosed below and is implemented in different and various forms. The embodiments bring about the complete disclosure of the present invention and are only provided to make those skilled in the art fully understand the scope of the present invention. The present invention is just defined by the scope of the appended claims.

Terms used in the present specification are provided for description of only specific embodiments of the present invention, and not intended to be limiting. In the present specification, an expression of a singular form includes the expression of plural form thereof if not specifically stated. The terms "comprises" and/or "comprising" used in the specification is intended to specify characteristics, numbers, steps, operations, components, parts or any combination thereof which are mentioned in the specification, and intended not to exclude the existence or addition of at least one another characteristics, numbers, steps, operations, components, parts or any combination thereof.

Unless differently defined, all terms used herein including technical and scientific terms have the same meaning as commonly understood by one of ordinary skill in the art to which the present invention belongs. Also, commonly used terms defined in the dictionary should not be ideally or excessively construed as long as the terms are not clearly and specifically defined in the present application.

It should be understood that various embodiments of the present invention are different from each other and need not be mutually exclusive. For example, a specific shape, structure and properties, which are described in this disclosure, may be implemented in other embodiments without departing from the spirit and scope of the present invention with respect to one embodiment. Also, it should be noted that positions, placements, or configurations of individual components within each disclosed embodiment may be changed without departing from the spirit and scope of the present invention.

Hereinafter, embodiments in accordance with the present invention will be described with reference to the accompanying drawings. The preferred embodiments are provided so that those skilled in the art can sufficiently understand the present invention, but can be modified in various forms and the scope of the present invention is not limited to the preferred embodiments.

Figure 1:
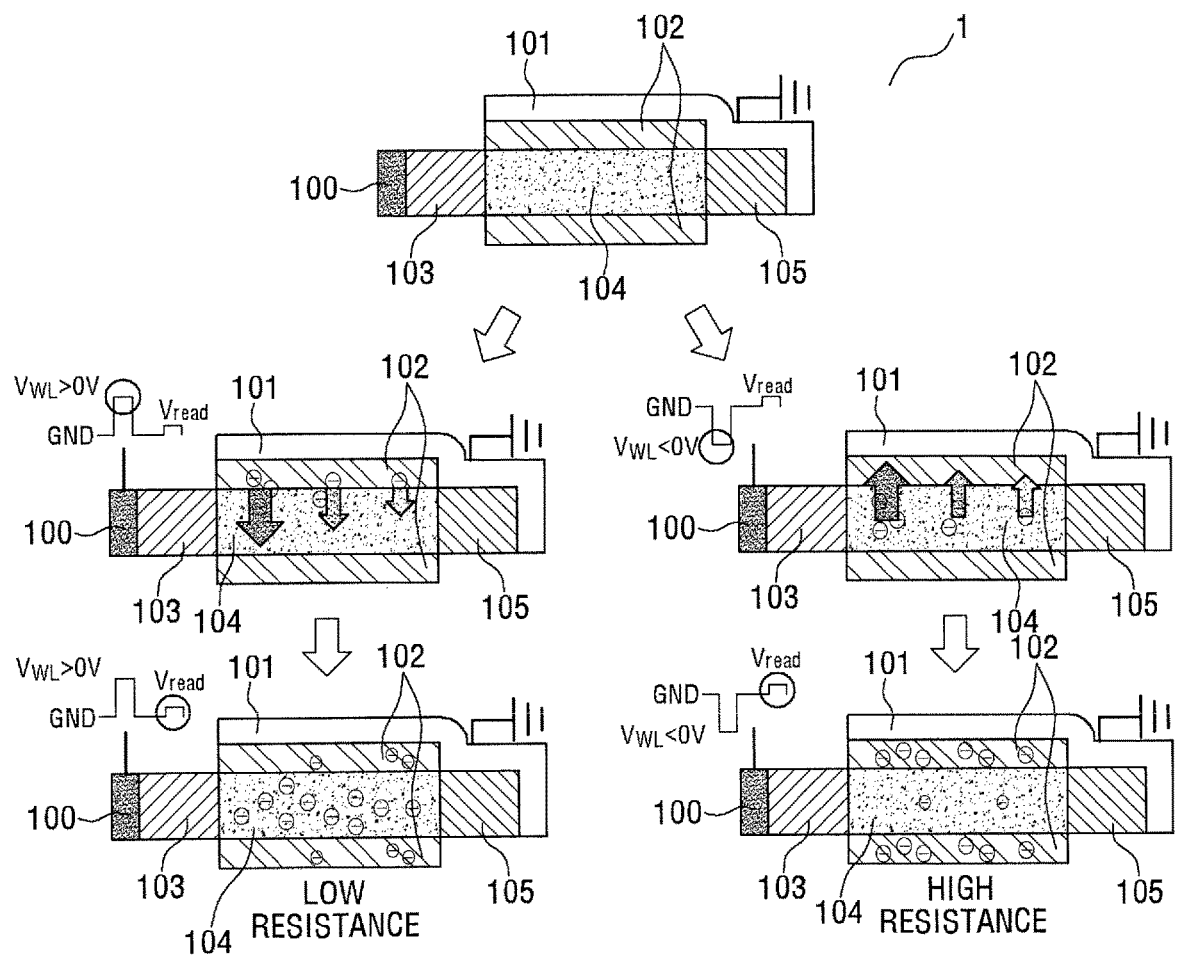
FIG. 1 is a view for describing a state where a pulse with positive voltage and a pulse with negative voltage have been respectively applied to a word line region of a semiconductor channel based neuromorphic synapse device including a trap-rich layer in accordance with an embodiment of the present invention, and characteristics of the neuromorphic synapse device thereof.

FIG. 1 is a view for describing a state where a pulse with positive voltage and a pulse with negative voltage have been respectively applied to a word line region of a semiconductor channel based neuromorphic synapse device 1 including a trap-rich layer in accordance with an embodiment of the present invention, and characteristics of the neuromorphic synapse device thereof.

The semiconductor channel based neuromorphic synapse device 1 including a trap-rich layer shown in FIG. 1 is advantageous when it has a vertical channel structure. However, for convenience, the semiconductor channel based neuromorphic synapse device 1 including a trap-rich layer is shown to have a horizontal channel structure. That is, the semiconductor channel based neuromorphic synapse device including a trap-rich layer may be configured to have a vertical channel structure or a horizontal channel structure.

As shown in FIG. 1, the semiconductor channel based neuromorphic synapse device 1 including a trap-rich layer in accordance with the embodiment of the present invention includes a word line 100, a bit line 101, a trap-rich layer 102 deposited around the channel, a first semiconductor region 103 that the word line contacts, a second semiconductor region 104 surrounded by the trap-rich layer, and a third semiconductor region 105 that the bit line contacts.

The trap-rich layer 102 may be made of at least one of silicon nitride ($Si_3N_4$), nitride, silicon oxynitride (SiON), silicon oxide ($SiO_2$), solid oxide film, aluminum oxide ($Al_2O_3$), and hafnium oxide ($HfO_2$) among materials having many traps.

The first semiconductor region 103 that the word line contacts, the third semiconductor region 105 that the bit line contacts, and the second semiconductor region 104 surrounded by the trap-rich layer may be formed to include (1) N-type impurity ion by ion-implanting N-type impurity such as, P, etc., and may be formed to include (2) P-type impurity ion by ion-implanting P-type impurity such as B.

The first to third semiconductor regions 103, 104, and 105 may be at least one of silicon (Si) wafer, germanium (Ge) wafer, III-V group compound wafer, and 2-D material (at least one of Carbon nanotube, $MoS_2$, and graphene) wafer, and are isolated from the outside.

Here, N-type or P-type impurity may be ion-implanted at a concentration higher than $5 \times 10^{18}$ $cm^{-3}$ into the first to third semiconductor regions 103, 104, and 105.

Also, N-type or P-type impurity may be ion-implanted at different concentrations into the first to third semiconductor regions 103, 104, and 105. That is, N-type or P-type impurity may be ion-implanted at a concentration higher than $1 \times 10^{19}$ $cm^{-3}$ into the first and the third semiconductor regions, and N-type or P-type impurity may be ion-implanted at a concentration less than $1 \times 10^{19}$ $cm^{-3}$ into the second semiconductor region.

On the left side of FIG. 1, the bit line 101 is grounded, and a pulse corresponding to a positive (+) voltage is applied to the word line 100. A potential difference which is generated between the trap-rich layer 102 and the drain region at this time causes electrons to escape from the trap-rich layer 102 to the second semiconductor region 104. As the number of the pulses which are applied to the word line 100 increases, the concentration of electrons emitted from the trap-rich layer 102 increases. Therefore, the number of electrons gathering on the second semiconductor region 104 (i.e., channel) increases, so that the resistance of the second semiconductor region 104 surrounded by the trap-rich layer 102 decreases. Accordingly, when a read voltage is applied to the word line 100, the magnitude of current increases as much as the positive pulse is applied. This indicates the potentiation characteristics of synapse.

On the right side of FIG. 1, the bit line 101 is grounded, and a pulse corresponding to a negative (−) voltage is applied to the word line 100. A potential difference which is generated between the trap-rich layer 102 and the drain region at this time causes electrons to be trapped in the trap-rich layer 102. As the number of the pulses which are applied to the word line 100 increases, the concentration of the electrons trapped in the trap-rich layer 102 increases. Therefore, the number of electrons gathering on the second semiconductor region 104 (i.e., channel) decreases, so that the resistance of the second semiconductor region 104 surrounded by the trap-rich layer 102 increases. Accordingly, when a read voltage is applied to the word line 100, the magnitude of current decreases as much as the negative pulse is applied. This indicates the depression characteristics of synapse.

Figure 2A:
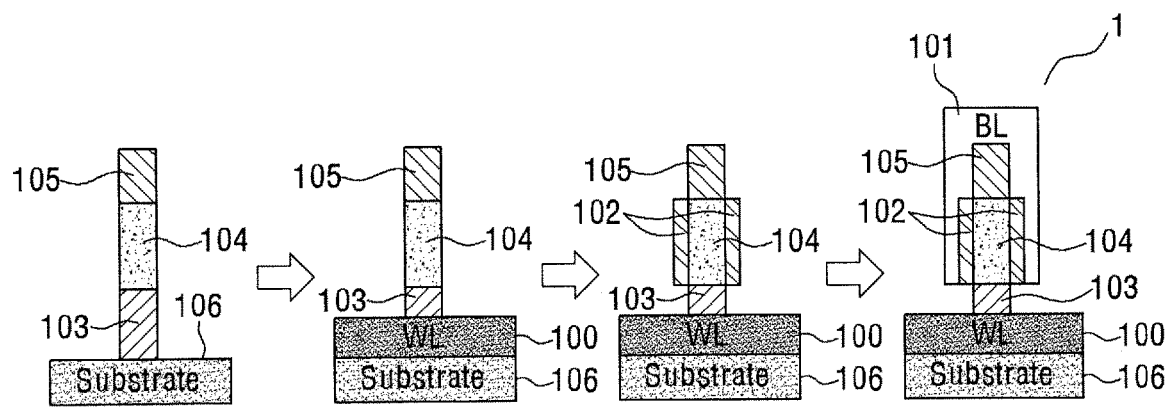
FIGS. 2a and 2b are views showing a manufacturing method in a case where a word line of the semiconductor channel based neuromorphic synapse device including a trap-rich layer in accordance with the embodiment of the present invention is arranged under the device.
Figure 2B:
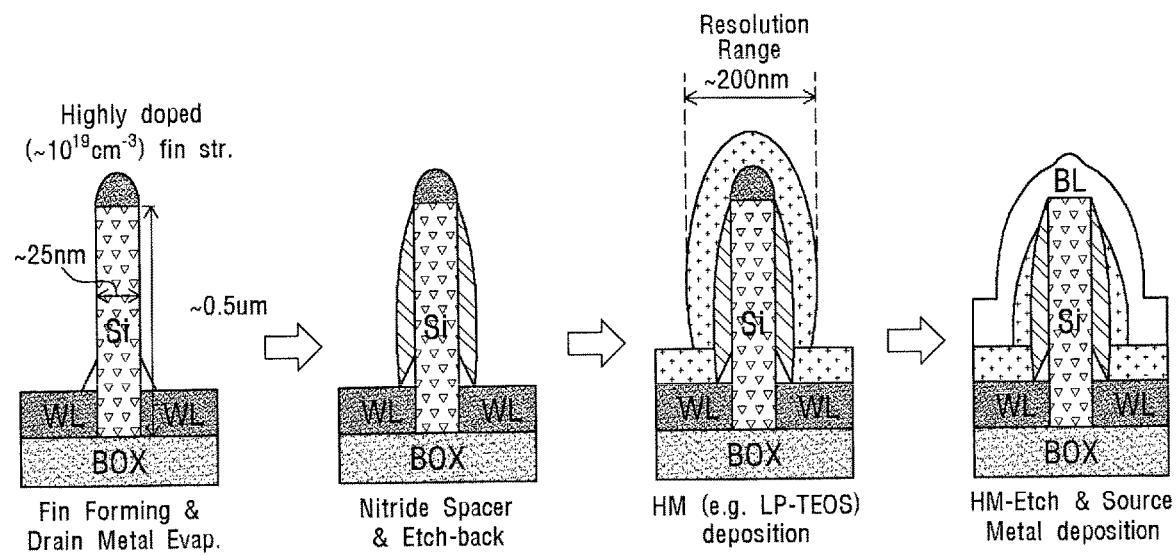

FIGS. 2a and 2b are views showing a manufacturing method in a case where the word line of the semiconductor channel based neuromorphic synapse device 1 including a trap-rich layer in accordance with the embodiment of the present invention is arranged under the device.

As shown in FIGS. 2a and 2b, the first to third semiconductor regions 103, 104, and 105 are formed on a substrate 106. Then, the word line 100 is formed, the trap-rich layer 102 is formed, and the bit line 101 is formed.

This will be described in detail by the following process.

(1) First, the fin or nanowire-shaped first to third semiconductor regions 103, 104, and 105 are formed on the substrate 106, and a metallic material is deposited by using PVD process (i.e., sputter, evaporator, etc.) such that the substrate 106 and the first to third semiconductor regions 103, 104, and 105 are covered. Here, the metallic material is finally used as the word line 100.

(2) Subsequently, in order to form the trap-rich layer 102, nitride is deposited and an etching process is performed overall (that is, etch-back process). By performing such an etch-back process, the trap-rich layer 102 remains only on the side surfaces of the first to third semiconductor regions 103, 104, and 105.

(3) Subsequently, a hard mask (e.g., an insulator such as oxide, etc.) is deposited.

(4) Then, after a portion of the hard mask is patterned, the metallic material is deposited again. As a result, the bit line 101 is finally formed on the first to third semiconductor regions 103, 104, and 105.

While the present invention has been described from the viewpoint of the specific embodiment including the exemplary embodiments of the present invention, it can be understood by those skilled in the art that various substitutions or modifications can be made in the configuration and sequence of the above-described manufacturing process of the present invention. Also, structural and functional changes can be variously made without departing from the right and scope of the present invention. Therefore, the basic idea or scope of the present invention should be construed broadly as described in the appended claims of the present invention.

Figure 3A:
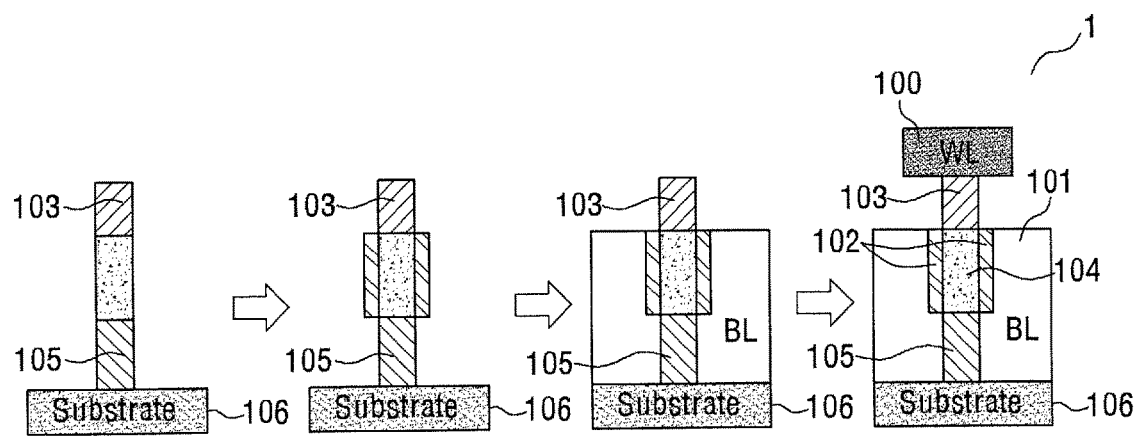
FIGS. 3a and 3b are views showing a manufacturing method in a case where the word line of the semiconductor channel based neuromorphic synapse device including a trap-rich layer in accordance with the embodiment of the present invention is arranged on the device.
Figure 3B:
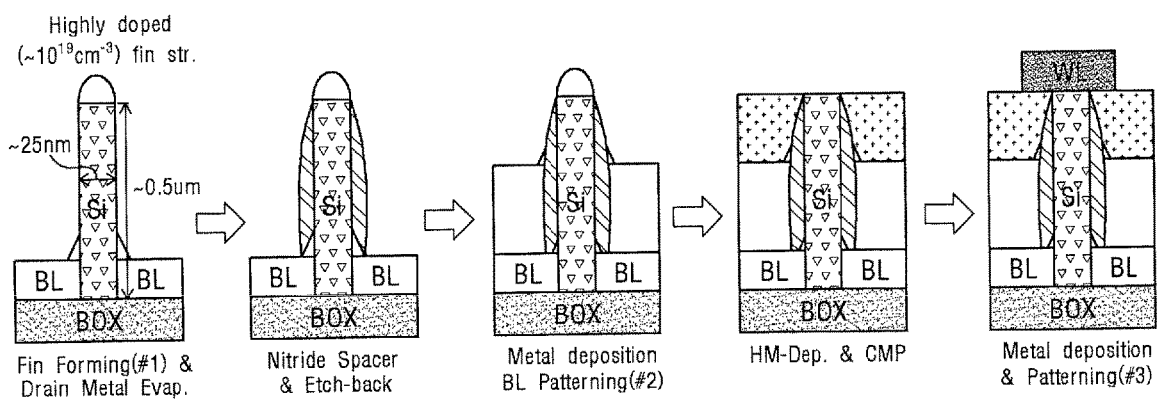

FIGS. 3a and 3b are views showing a manufacturing method in a case where the word line of the semiconductor channel based neuromorphic synapse device 1 including a trap-rich layer in accordance with the embodiment of the present invention is arranged on the device.

As shown in FIGS. 3a and 3b, the first to third semiconductor regions 103, 104, and 105 are formed on a substrate 106. Then, a portion of the bit line 101 is formed, the trap-rich layer 102 is formed, and then the remaining bit line 101 is formed. Subsequently, the hard mask is deposited, and the word line 100 is formed.

This will be described in detail by the following process.

(1) First, the fin or nanowire-shaped first to third semiconductor regions 103, 104, and 105 are formed on the substrate 106, and a metallic material is deposited by using PVD process (i.e., sputter, evaporator, etc.) such that the substrate 106 and the first to third semiconductor regions 103, 104, and 105 are covered. Here, the metallic material is finally used as the word line 100.

(2) Subsequently, in order to form the trap-rich layer 102, nitride is deposited and an etching process is performed overall (that is, etch-back process). By performing such an etch-back process, the trap-rich layer 102 remains only on the side surfaces of the first to third semiconductor regions 103, 104, and 105.

(3) Subsequently, the metallic material is deposited again, so that the metallic material comes in contact with the trap-rich layer 102 as well.

(4) Subsequently, a hard mask is deposited, and chemical mechanical polishing (CMP) process is performed. As a result, an overall flattened structure is formed.

(5) Subsequently, the metallic material is deposited again and then patterned, the shape of the word line 100 remains and is finally used.

Here as well, while the present invention has been described from the viewpoint of the specific embodiment including the exemplary embodiments of the present invention, it can be understood by those skilled in the art that various substitutions or modifications can be made in the configuration and sequence of the above-described manufacturing process of the present invention. Also, structural and functional changes can be variously made without departing from the right and scope of the present invention. Therefore, the basic idea or scope of the present invention should be construed broadly as described in the appended claims of the present invention.

Figure 4:
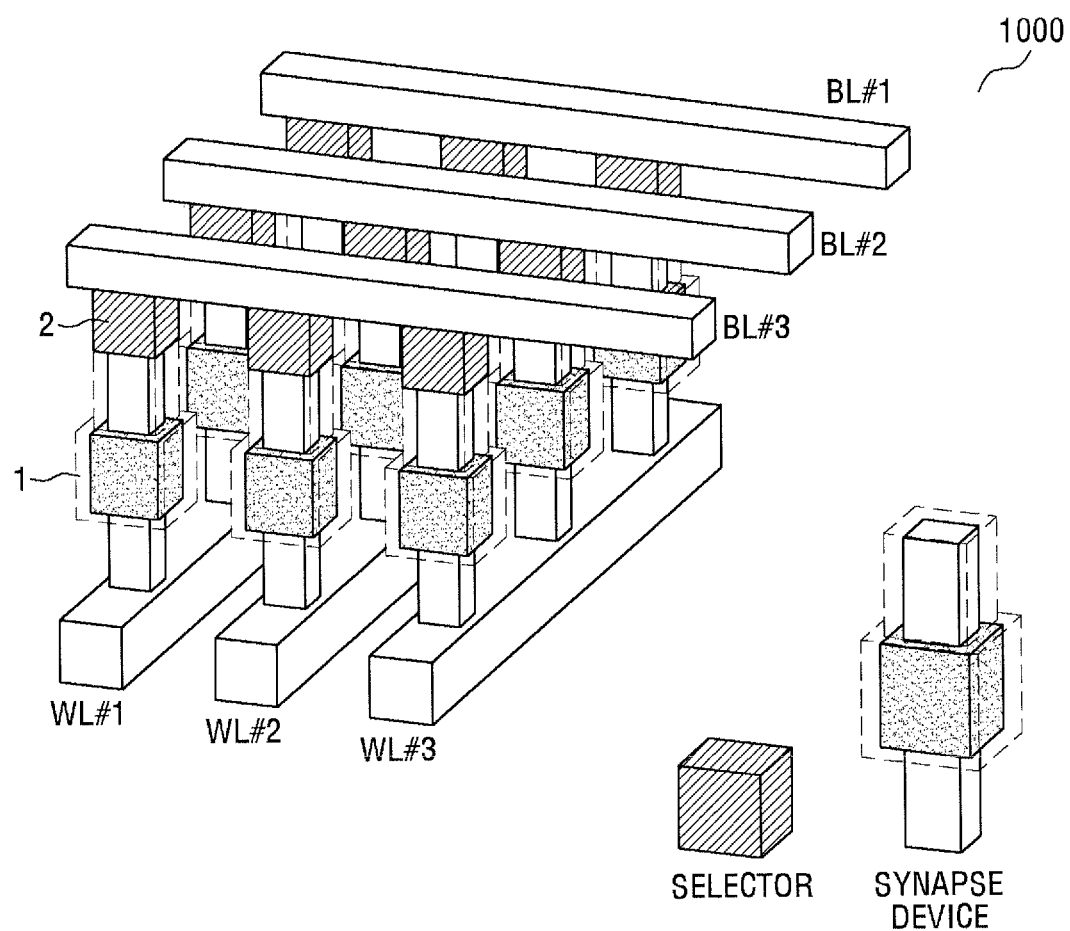
FIG. 4 is a view showing the configuration of an array of the semiconductor channel based neuromorphic synapse device including a trap-rich layer in accordance with the embodiment of the present invention.

FIG. 4 is a view showing the configuration of an array 1000 of the semiconductor channel based neuromorphic synapse device including a trap-rich layer in accordance with the embodiment of the present invention.

In particular, FIG. 4 shows a cross-bar array structure formed by using a selector 2 and the semiconductor channel based neuromorphic synapse device 1 including a trap-rich layer in the case where the word line is disposed under the device.

The synapse device 1 corresponds to the above-described synapse device 1. The selector 2 may be disposed on the synapse device 1. A plurality of the synapse devices 1 and a plurality of the selectors 2 can be electrically connected to each other by using a plurality of the word lines and a plurality of the bit lines.

Referring to FIG. 4, the plurality of bit lines and the plurality of word lines may be disposed in different layers in such a manner as to be apart from each other by a predetermined interval. Here, the plurality of selectors 2 and the plurality of synapse devices 1 may be disposed between the plurality of bit lines and the plurality of word lines. The plurality of bit lines may be disposed in the same layer, and the plurality of word lines may be disposed in the same layer. The plurality of bit lines may be disposed in a row direction, and the plurality of word lines may be disposed in a column direction crossing the row direction. The plurality of bit lines may be spaced apart from each other at the same interval, and the plurality of word lines may be spaced apart from each other at the same interval.

Meanwhile, the plurality of selectors 2 may be electrically connected to one bit line, and the plurality of synapse devices 1 may be electrically connected to one word line. Also, the selectors 2 and the synapse devices 1 may be disposed one to one corresponding to each other. One end of the selector 2 may be electrically connected to the bit line, and one end of the synapse device 1 may be electrically connected to the word line. While FIG. 4 shows that the top surface of the selector 2 is electrically connected to the bit line and the bottom surface of the synapse device 1 is electrically connected to the word line, the scope of the present invention is not limited to this. It is possible that the top surface of the selector 2 may be electrically connected to the word line and the bottom surface of the synapse device 1 may be electrically connected to the bit line. According to the embodiment of the present invention, any one of the front/rear/side surfaces of the selector 2 may be connected to the bit line, and any one of the front/rear/side surfaces of the synapse device may be connected to the word line. According to another embodiment of the present invention, any one of the front/rear/side surfaces of the selector 2 may be connected to the word line, and any one of the front/rear/side surfaces of the synapse device 1 may be connected to the bit line.

Figure 5:
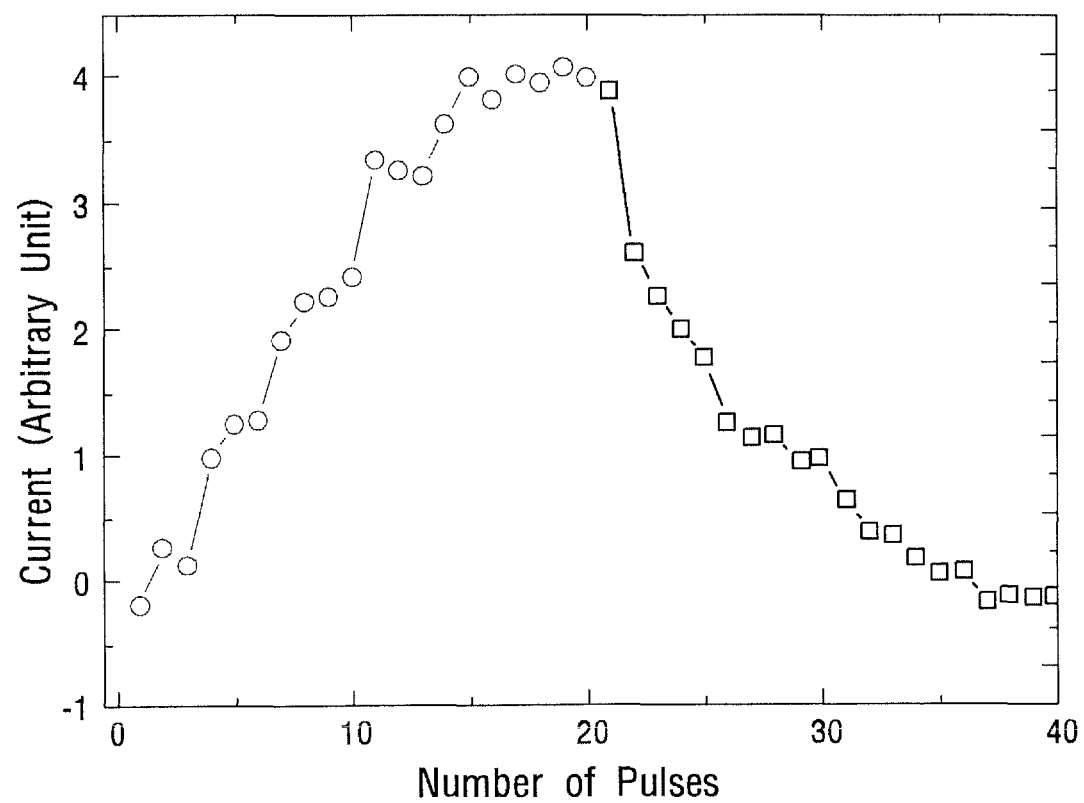
FIG. 5 is a view showing the potentiation and depression of the of the semiconductor channel based neuromorphic synapse device including a trap-rich layer in accordance with the embodiment of the present invention.

FIG. 5 is a view showing the potentiation and depression of the of the semiconductor channel based neuromorphic synapse device including a trap-rich layer in accordance with the embodiment of the present invention.

Referring to FIG. 5, it can be understood that when a pulse with a positive value is applied to the word line of the synapse device, the potentiation occurs with the increase of the number of the pulses and when a pulse with a negative value is applied to the word line of the synapse device, the depression occurs with the increase of the number of the pulses.

The features, structures and effects and the like described in the embodiments are included in one embodiment of the present invention and are not necessarily limited to one embodiment. Furthermore, the features, structures, effects and the like provided in each embodiment can be combined or modified in other embodiments by those skilled in the art to which the embodiments belong. Therefore, contents related to the combination and modification should be construed to be included in the scope of the present invention.

Although embodiments of the present invention were described above, these are just examples and do not limit the present invention. Further, the present invention may be changed and modified in various ways, without departing from the essential features of the present invention, by those skilled in the art. For example, the components described in detail in the embodiments of the present invention may be modified. Further, differences due to the modification and application should be construed as being included in the scope and spirit of the present invention, which is described in the accompanying claims.

REFERENCE NUMERALS

100: word line
101: bit line
102: trap-rich layer
103: first semiconductor region
104: second semiconductor region
105: third semiconductor region
106: substrate

What is claimed is:

1. A semiconductor channel based neuromorphic synapse device including a trap-rich layer, the neuromorphic synapse device comprising:
   a first to a third semiconductor regions which are formed on a substrate and are sequentially arranged;
   a word line which is electrically connected to the first semiconductor region;
   a trap-rich layer which surrounds the second semiconductor region; and
   a bit line which is electrically connected to the third semiconductor region,
   wherein, when a pulse with positive (+) voltage is applied to the word line, a concentration of electrons emitted from the trap-rich layer to the second semiconductor region increases and a resistance of the second semiconductor region decreases,
   wherein, when a pulse with negative (−) voltage is applied to the word line, a concentration of electrons trapped in the trap-rich layer from the second semiconductor region increases and the resistance of the second semiconductor region increases, and
   wherein the bit line contacts the third semiconductor region and the trap-rich layer.

2. The neuromorphic synapse device of claim 1, wherein the first to third semiconductor regions are formed to have a vertical structure or a horizontal structure on the substrate.

3. The neuromorphic synapse device of claim 1, wherein the first to third semiconductor regions comprise at least one of silicon (Si), germanium (Ge), III-V group compound, and 2-D material (at least one of Carbon nanotube, $MoS_2$, and graphene).

4. The neuromorphic synapse device of claim 1, wherein N-type or P-type impurity is ion-implanted at a concentration higher than $5\times10^{18}$ cm$^{-3}$ into the first to third semiconductor regions.

5. The neuromorphic synapse device of claim 1, wherein N-type or P-type impurity is ion-implanted at different concentrations into the first to third semiconductor regions.

6. The semiconductor channel based neuromorphic synapse device of claim 5, wherein the N-type or P-type impurity is ion-implanted at a concentration higher than $1\times10^{19}$ cm$^{-3}$ into the first and the third semiconductor regions, and N-type or P-type impurity is ion-implanted at a concentration less than $1\times10^{19}$ cm$^{-3}$ into the second semiconductor region.

7. The semiconductor channel based neuromorphic synapse device of claim 1, wherein the trap-rich layer comprises at least one of silicon nitride ($Si_3N_4$), nitride, silicon oxynitride (SiON), silicon oxide ($SiO_2$), solid oxide film, aluminum oxide ($Al_2O_3$), and hafnium oxide ($HfO_2$).

* * * * *